US010528865B2

(12) United States Patent
Kim et al.

(10) Patent No.: US 10,528,865 B2
(45) Date of Patent: Jan. 7, 2020

(54) SYSTEM TO DUPLICATE NEUROMORPHIC CORE FUNCTIONALITY

(71) Applicant: International Business Machines Corporation, Armonk, NY (US)

(72) Inventors: SangBum Kim, Yorktown Heights, NY (US); Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 762 days.

(21) Appl. No.: 15/188,663

(22) Filed: Jun. 21, 2016

(65) Prior Publication Data

US 2017/0364793 A1    Dec. 21, 2017

(51) Int. Cl.
*G06N 3/063* (2006.01)
*G11C 13/00* (2006.01)
(Continued)

(52) U.S. Cl.
CPC .......... *G06N 3/0635* (2013.01); *G06N 3/049* (2013.01); *G06N 3/088* (2013.01); *G11C 11/54* (2013.01); *G11C 13/0004* (2013.01); *G11C 7/1006* (2013.01); *G11C 13/0069* (2013.01); *G11C 2213/70* (2013.01)

(58) Field of Classification Search
CPC .......................... G06N 3/0635; G11C 13/0004
See application file for complete search history.

(56) References Cited

U.S. PATENT DOCUMENTS

2012/0084241 A1* 4/2012 Friedman ............... G06N 3/049
706/27
2012/0317063 A1* 12/2012 Sim ....................... G06N 3/063
706/27
(Continued)

OTHER PUBLICATIONS

Tae-Youl Yang, Effects of dopings on the electric-field-induced atomic migration and void formation in Ge2Sb2Te5, Jul. 2011, 18th IEEE International Symposium on the Physical and Failure Analysis of Integrated Circuits (IPFA), 4 pages (Year: 2011).*
(Continued)

*Primary Examiner* — Miranda M Huang
*Assistant Examiner* — Seth Andrew Raker
(74) *Attorney, Agent, or Firm* — Ido Tuchman; Erik K. Johnson

(57) ABSTRACT

A neuromorphic memory circuit including a memory cell with a programmable resistive memory element. A postsynaptic capacitor builds up a leaky integrate and fire (LIF) charge. An axon LIF pulse generator activates a LIF discharge path from the postsynaptic capacitor through the resistive memory element when the axon LIF pulse generator generates axon LIF pulses. A postsynaptic comparator compares the capacitor voltage to a threshold voltage and generates postsynaptic output pulses when the capacitor voltage passes the threshold voltage. The postsynaptic output pulses include a postsynaptic firing characteristic dependent on a frequency of the axon LIF pulses. A refractory circuit prevents the postsynaptic comparator from generating additional postsynaptic output pulses until a refractory time passes since a preceding postsynaptic output pulse. A training circuit adjusts the postsynaptic firing characteristic to match a target firing characteristic.

20 Claims, 11 Drawing Sheets

(51) Int. Cl.
*G06N 3/04* (2006.01)
*G06N 3/08* (2006.01)
*G11C 11/54* (2006.01)
*G11C 7/10* (2006.01)

(56) References Cited

U.S. PATENT DOCUMENTS

| | | | | |
|---|---|---|---|---|
| 2012/0330873 A1* | 12/2012 | Suri | ......................... | H01L 45/04 |
| | | | | 706/26 |
| 2014/0258194 A1* | 9/2014 | Towal | ...................... | G06N 3/02 |
| | | | | 706/15 |
| 2015/0039547 A1* | 2/2015 | Kang | ..................... | G06N 3/049 |
| | | | | 706/42 |

OTHER PUBLICATIONS

J. V. Arthur et al., "Building block of a programmable neuromorphic substrate: A digital neurosynaptic core," 2012 Int. Jt. Conf. Neural Networks, pp. 1-8 (Jun. 2012).

\* cited by examiner

SYSTEM TO DUPLICATE NEUROMORPHIC CORE FUNCTIONALITY

BACKGROUND

This invention relates generally to memory circuits, and more particularly to a neuromorphic memory circuit for neuromorphic applications.

Neuromorphic computing is motivated by the computational method used by the biological brains (more specifically mammal cerebral cortex) mainly comprised by neurons and synapses. The term "neuron" was coined by Heinrich Wilhelm Gottfried von Waldeyer-Hartz in 1891 to capture the discrete information processing units of the brain. The junctions between two neurons were termed "synapses" by Sir Charles Sherrington in 1897. Information flows only along one direction through a synapse, thus we talk about a "presynaptic" and a "postsynaptic" neuron. Neurons, when activated by sufficient input received via synapses, emit "spikes" that are delivered to those synapses that the neuron is pre-synaptic to.

It is theorized that experiences are captured as conductance of the synapses in the brain. The synaptic conductance changes with time as a function of the relative spike times of presynaptic and post-synaptic neurons. The conductance of a synapse increases if a postsynaptic neuron fires after its pre-synaptic neuron fires, and decreases in conductance if the order of the two firings is reversed. Furthermore, the change depends on the precise delay between the two events, such that the more the delay, the less the magnitude of change.

Computational methods used by the biological brains are quite different from that of today's computer systems which is based on the Von Neumann architecture. Neuromorphic systems, also referred to as artificial neural networks, are computational systems that permit electronic systems to essentially function in a manner analogous to that of biological brains. Neuromorphic systems do not generally utilize a traditional digital model of manipulating 0s and 1s. Instead, neuromorphic systems create connections between processing elements that are roughly functionally equivalent to neurons of a biological brain. Neuromorphic systems may include various electronic circuits that model biological neurons.

BRIEF SUMMARY

Accordingly, one example aspect of the present invention is a neuromorphic memory circuit comprising a memory cell that includes a resistive memory element programmable to a memory resistance. A postsynaptic capacitor is configured to build up a leaky integrate and fire (LIF) charge. The postsynaptic capacitor includes a capacitor voltage proportional to the LIF charge. An axon LIF pulse generator is configured to activate a LIF discharge path from the postsynaptic capacitor through the resistive memory element when the axon LIF pulse generator generates axon LIF pulses. A postsynaptic comparator is configured to compare the capacitor voltage to a threshold voltage and generate postsynaptic output pulses when the capacitor voltage passes the threshold voltage. The postsynaptic output pulses include a postsynaptic firing characteristic dependent on a frequency of the axon LIF pulses. A refractory circuit is coupled to the postsynaptic comparator and is configured to prevent the postsynaptic comparator from generating additional postsynaptic output pulses until a refractory time passes since a preceding postsynaptic output pulse.

A training circuit is configured to adjust the postsynaptic firing characteristic to match a target firing characteristic. The postsynaptic firing characteristic includes a postsynaptic firing rate that rises from a postsynaptic threshold frequency along a postsynaptic curve slope that asymptotically approaches a postsynaptic maximum frequency. Similarly, the target firing characteristic includes a target firing rate that rises from a target threshold frequency along a target curve slope that asymptotically approaches a target maximum frequency.

Another example aspect of the present invention is a neuromorphic memory circuit comprising memory cell array. Each memory cell in the memory cell array includes a resistive memory element programmable to a memory resistance. A postsynaptic capacitor is coupled to a row of memory cells in the memory cell array. The postsynaptic capacitor builds up a leaky integrate and fire (LIF) charge at a charge rate over time and includes a capacitor voltage proportional to the LIF charge. An axon LIF pulse generator is coupled to a column of memory cells in the memory cell array. The axon LIF pulse generator activates a LIF discharge path from the postsynaptic capacitor through the resistive memory element when the axon LIF pulse generator generates axon LIF pulses. A postsynaptic comparator compares the capacitor voltage to a threshold voltage and generates postsynaptic output pulses when the capacitor voltage passes the threshold voltage. The postsynaptic output pulses include a postsynaptic firing characteristic dependent on a frequency of the axon LIF pulses. A refractory circuit is coupled to the postsynaptic comparator and is configured to prevent the postsynaptic comparator from generating additional postsynaptic output pulses until a refractory time passes since a preceding postsynaptic output pulse. A training circuit is configured to adjust the postsynaptic firing characteristic to match a target firing characteristic. The postsynaptic firing characteristic includes a postsynaptic firing rate that rises from a postsynaptic threshold frequency along a postsynaptic curve slope that asymptotically approaches a postsynaptic maximum frequency. The target firing characteristic includes a target firing rate that rises from a target threshold frequency along a target curve slope that asymptotically approaches a target maximum frequency.

Yet another example aspect of the present invention is a method for operating a neuromorphic memory circuit. The method includes accumulating a dendrite leaky integrate and fire (LIF) charge over time on a conductive dendrite LIF line. The conductive dendrite LIF line includes a LIF voltage proportional to the LIF charge. A generating operation generates axon LIF pulses. The axon LIF pulses activate a LIF discharge path from the conductive dendrite LIF line through a programmable resistive memory element. Another generating operation generates postsynaptic output pulses in response to the LIF voltage passing a threshold voltage. A measuring operation measures a postsynaptic firing characteristic of the programmable resistive memory element over a range of axon LIF pulse frequencies. The postsynaptic firing characteristic includes a postsynaptic firing rate that rises from a postsynaptic threshold frequency along a postsynaptic curve slope that asymptotically approaches a postsynaptic maximum frequency. An adjusting operation adjusts the postsynaptic firing characteristic to match a target firing characteristic. The target firing characteristic includes a target firing rate that rises from a target threshold frequency along a target curve slope that asymptotically approaches a target maximum frequency.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
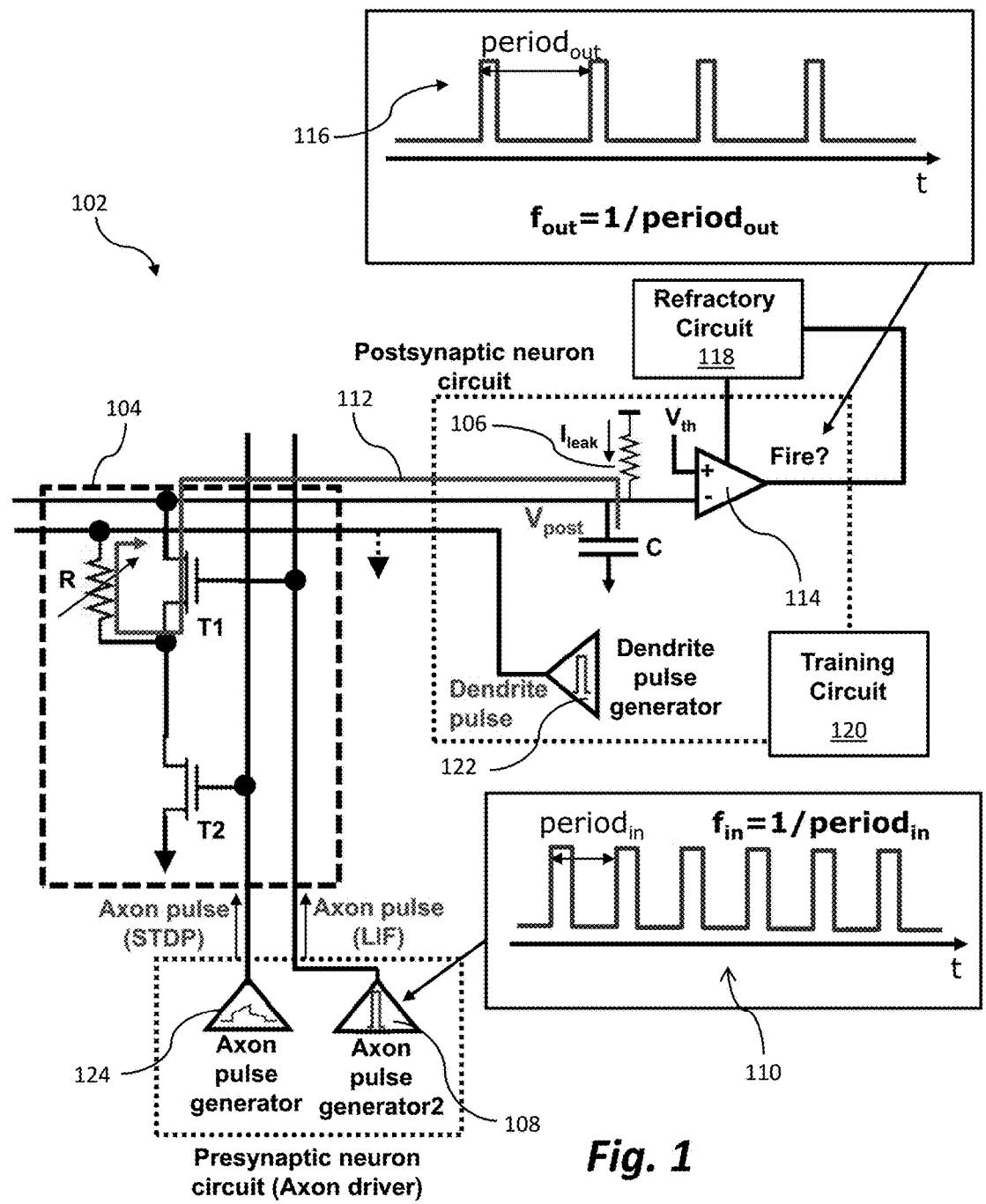
FIG. 1 shows an example two transistor, one resistor (2T-1R) neuromorphic memory circuit according to one aspect of the present invention.

The present invention is described with reference to embodiments of the invention. Throughout the description of the invention reference is made to FIGS. 1-11. When referring to the figures, like structures and elements shown throughout are indicated with like reference numerals.

A neuron behavior model may include a presynaptic neuron connected to a postsynaptic neuron via a synapse. The following variables can be defined:

$V_{pre}(t)$ is a membrane potential of presynaptic neuron (as a function of time).

$V_{post}(t)$ is a membrane potential of postsynaptic neuron (as a function of time).

w is a synaptic weight. Synaptic weight is the influence that a pre-synaptic firing will have on post-synaptic neuron.

$t_{pre}$ is a time when presynaptic neuron fires.

$t_{post}$ is a time when postsynaptic neuron fires.

Furthermore, the behavior model defines two functions: leaky integrate and fire (LIF) and spike timing dependent plasticity (STDP). LIF is a function that determines the $V_{post}$ of the cell body. When the presynaptic neuron fires, $\Delta V_{post}$ is proportional to w. STDP is a function that determines w. $\Delta w$ is a function of $\Delta t$ ($t_{post}-t_{pre}$). In other words, $\Delta w$ is a function of the timing difference between postsynaptic and presynaptic neuron firing. In STDP, synapses are only strengthened if the firing of their pre-synaptic neuron precede, and thus could have contributed to, the firing of the post synaptic neuron. Accidental, non-causal coincidences will weaken synapses.

Memory devices may store synaptic weights in the form of resistance of the memory element. The memory element may be phase change memory, metal oxide resistance change memory, and conductive bridge memory. After its fabrication, each neuromorphic core needs to learn how to conduct functions such as image and voice recognition. Typical methods of learning algorithms, such as STDP and back-propagation, take a substantial time to train a neuromorphic core with large amount of labeled and unlabeled data. Therefore, it is often prohibitive to train multiple neuromorphic cores due to time constraints.

As discussed in detail below, aspects of the present invention relate to functionally duplicating neuromorphic memory cores, such as the neuromorphic memory cores disclosed in U.S. patent application Ser. No. 14/596,223, filed Jan. 14, 2015, titled "NEUROMORPHIC MEMORY CIRCUIT", and incorporated by reference herein in its entirety.

A neuromorphic core can be considered as a system which generates output for given input. Both input and output can be temporal. Thus, if two neuromorphic cores generate the same output for any given input, the two neuromorphic cores can be considered functionally identical. Instead of training each neuromorphic core, only one neuromorphic core is trained and functionally identical neuromorphic cores are duplicated by transferring learned synaptic weights and other learned parameters to all the other neuromorphic cores. This can save a lot of time required for training multiple neuromorphic cores.

Aspects of the present invention transfer a firing characteristic from one neuromorphic core to another to make the neuromorphic cores functionally identical. In one embodiment, a firing characteristic includes a firing rate that rises from a threshold frequency along a curve slope that asymptotically approaches a maximum frequency.

FIG. 1 shows an example two transistor, one resistor (2T-1R) neuromorphic memory circuit 102 contemplated by the present invention. The circuit 102 includes a memory cell 104 with a resistive memory element R programmable to a memory resistance. In one embodiment, the resistive memory element R is composed of a phase change material, such as GST.

The circuit 102 includes a postsynaptic capacitor C to build up a LIF charge at a charge rate over time. The postsynaptic capacitor includes a capacitor voltage $V_{post}$ proportional to the LIF charge. In one embodiment, the circuit 102 includes a leak resistor 106 coupled to a source voltage and the postsynaptic capacitor C. Leakage current $I_{leak}$ flows through the leak resistor 106, causing the capacitor voltage $V_{post}$ to build up charge over time. In a particular embodiment, the leakage current $I_{leak}$ flows through a leak transistor coupled to the postsynaptic capacitor C, with the leak transistor configured to control the charge rate of the postsynaptic capacitor C.

An axon LIF pulse generator 108 is configured to activate a LIF discharge path 112 from the postsynaptic capacitor C through the resistive memory element R when the axon LIF pulse generator 108 generates axon LIF pulses 110. Thus, as shown in FIG. 2, when the axon LIF pulse generator 108 generates an axon LIF pulse 110, the capacitor voltage $V_{post}$ drops.

Turning back to FIG. 1, the circuit 102 includes a postsynaptic comparator 114 to compare the capacitor voltage $V_{post}$ to a threshold voltage $V_{th}$. The postsynaptic comparator 114 generates postsynaptic output pulses 116 when the capacitor voltage $V_{post}$ passes the threshold voltage. Thus, the postsynaptic output pulses 116 have a postsynaptic firing characteristic dependent on the frequency of the axon LIF pulses 110.

Figure 2:
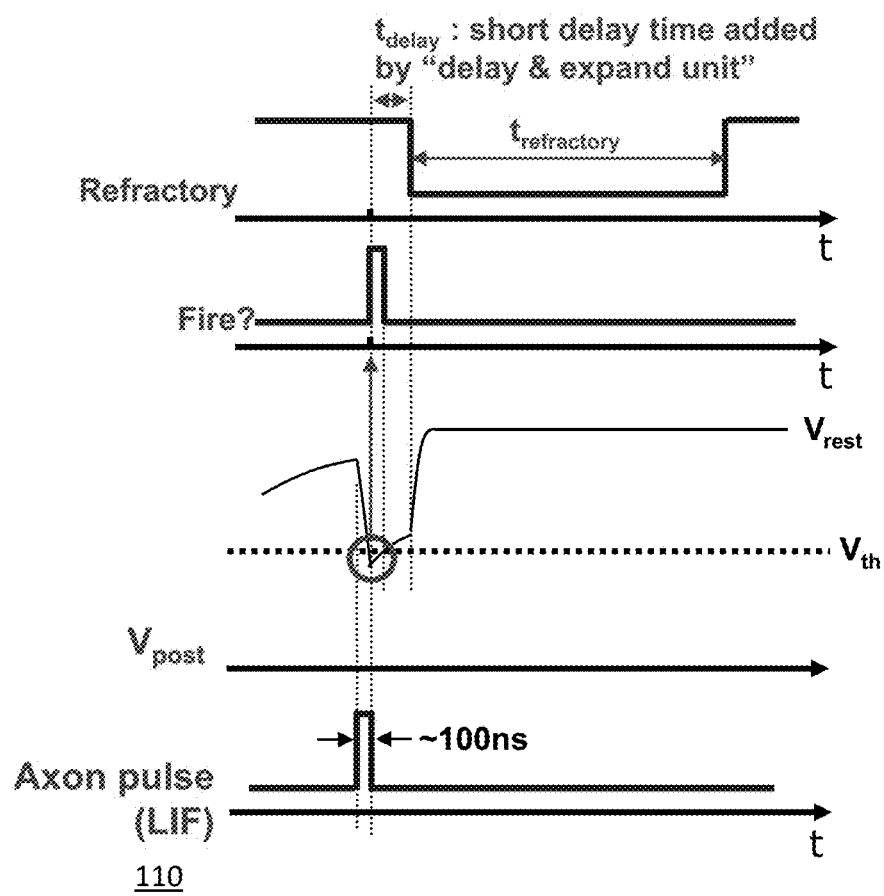
FIG. 2 shows an example of the capacitor voltage at the postsynaptic capacitor dropping below the threshold voltage during transmission of an axon LIF pulse.

FIG. 2 shows an example of the capacitor voltage $V_{post}$ at the postsynaptic capacitor C dropping below the threshold voltage $V_{th}$ during transmission of an axon LIF pulse 110. As a result, the postsynaptic comparator 114 fires.

Returning to FIG. 1, a refractory circuit 118 is coupled to the postsynaptic comparator 114. The refractory circuit 118 is configured to prevent the postsynaptic comparator 114 from generating additional postsynaptic output pulses until a refractory time ($t_{refractory}$ in FIG. 2) passes since a preceding postsynaptic output pulse. In one embodiment, the refractory circuit 118 is configured to prevent the capacitor voltage $V_{post}$ from passing the threshold voltage $V_{th}$ until the refractory time passes.

Figure 3:
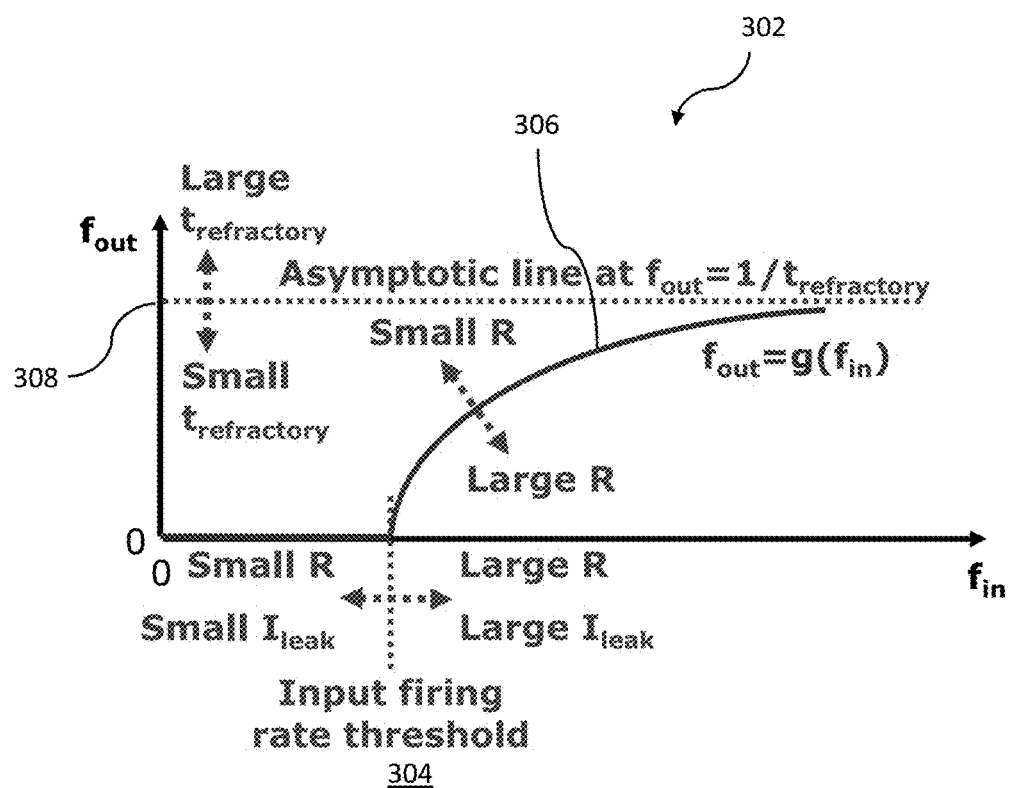
FIG. 3 shows an example firing characteristic contemplated by the present invention.
Figure 4:
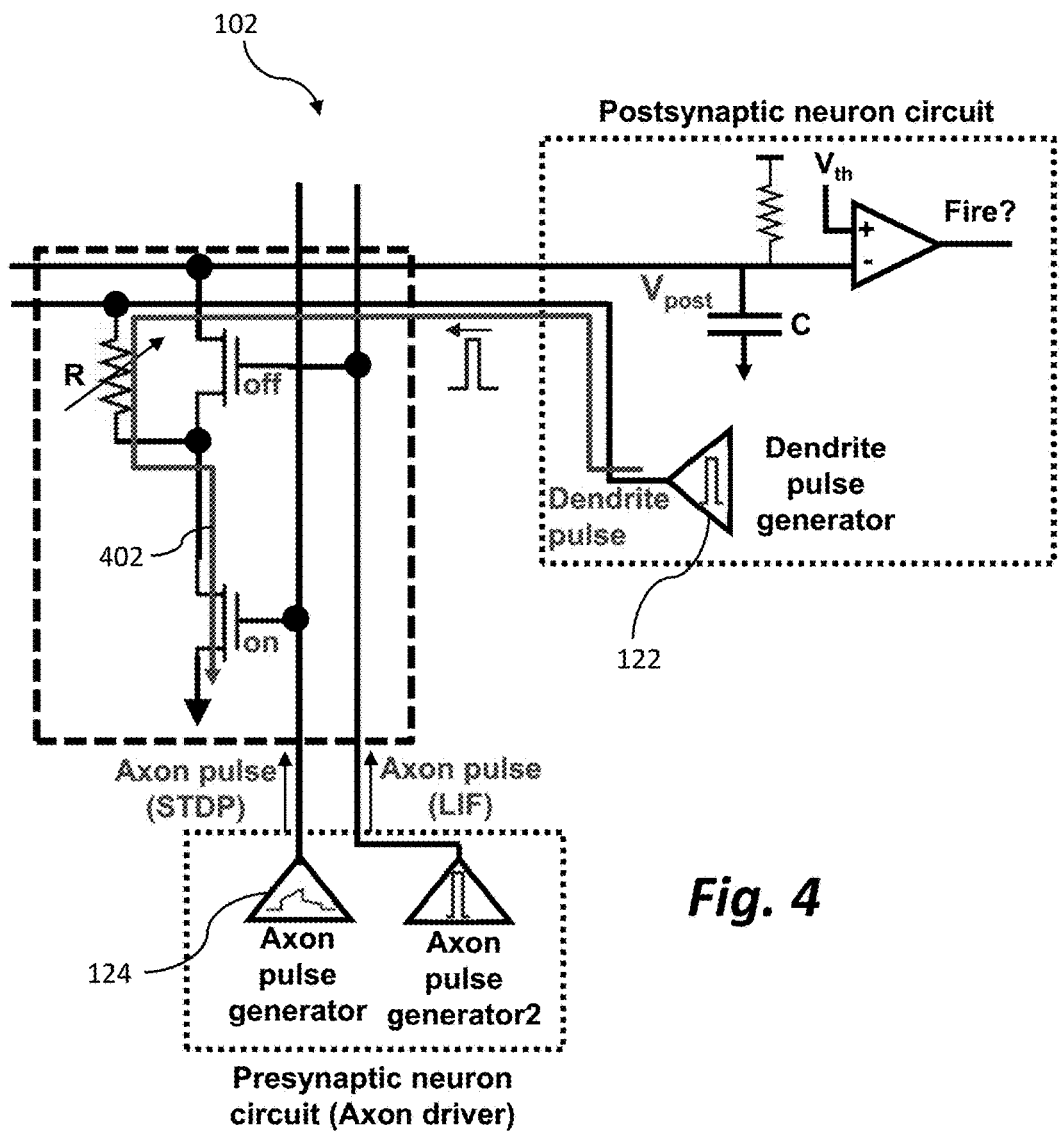
FIG. 4 shows an example a STDP discharge path activated by an axon STDP pulse generator generating an axon STDP pulse.

The circuit 102 also includes a training circuit 120 configured to measure and adjust the postsynaptic firing characteristic to match a target firing characteristic. FIG. 3 shows an example firing characteristic 302 contemplated by the present invention. As shown, the firing characteristic 302 includes a firing rate $f_{out}$ that rises from a threshold frequency 304 along a curve slope 306 that asymptotically approaches a maximum frequency 308. Similarly, the target firing characteristic includes a target firing rate that rises from a target threshold frequency along a target curve slope that asymptotically approaches a target maximum frequency.

The firing characteristic may be defined as $f_{out}=g(f_{in})$, where the firing characteristic, $g(f_{in})$, is determined by a resistance of a selected resistive memory element R, a refractory time $t_{refractory}$, and an amount of leakage current $I_{leak}$. Thus, as illustrated in FIG. 3, changing R, $t_{refractory}$, and $I_{leak}$ changes the postsynaptic firing characteristic to the desired target firing characteristic.

Accordingly, in one embodiment, the training circuit 120 is configured to adjust the refractory time of the refractory circuit 118 such that the postsynaptic maximum frequency of the postsynaptic firing characteristic matches the target maximum frequency of the target firing characteristic. The training circuit 120 is also configured to adjust the memory resistance of the resistive memory element R such that the postsynaptic curve slope of the postsynaptic firing characteristic matches the target curve slope of the target firing characteristic. The training circuit 120 is additionally configured to adjust the charge rate of the postsynaptic capacitor C such that the postsynaptic threshold frequency of the postsynaptic firing characteristic matches the target threshold frequency of the target firing characteristic.

As mentioned above, the resistive memory element R may be phase change memory. In phase change memory, information is generally stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase (also referred to as the reset state) has a higher resistance than the crystalline phase (also referred to as the set state).

In a particular embodiment, the phase change material is composed of $Ge_xSb_yTe_z$, where a Ge atomic concentration x is within a range from 30% to 70%, a Sb atomic concentration y is within a range from 10% to 30%, and a Te atomic concentration z is within a range from 20% to 50%. U.S. patent application Ser. No. 14/596,223, filed Jan. 14, 2015, titled "PHASE CHANGE MEMORY WITH METASTABLE SET AND RESET STATES", and incorporated by reference herein in its entirety, discloses the electrical resistance of such phase change material programmed to the set state or the reset state drifts toward the initial electrical resistance over time that is useful in real-time self-learning applications.

In one embodiment, the phase change material has an electrical resistance and is programmable to a set state having a set electrical resistance and reset state having a reset electrical resistance at least a factor of 10 greater than the set electrical resistance. The phase change material may include an initial state with an initial electrical resistance between the set electrical resistance and the reset electrical resistance. Furthermore, the initial state is at a lower potential energy than the set state and the reset state such that the electrical resistance of the phase change material programmed to either the set state or the reset state drifts toward the initial electrical resistance over time. In other words, the set and reset states are metastable states, and the initial state is the ground state.

Returning to FIG. 1, adjusting the memory resistance of the resistive memory element R can be achieved by a dendrite pulse generator 122 and an axon STDP pulse generator 124. The dendrite pulse generator 122 is coupled to the resistive memory element R and, in one mode of operation, is configured to generate dendrite pulses in response to the postsynaptic output pulses 116. The axon STDP pulse generator 124 generates an axon STDP pulse that activates a STDP discharge path 402 (see FIG. 4) from the dendrite pulse generator 122 through the resistive memory element R. The resistive memory element R is programmed to a desired memory resistance by generating the dendrite pulses while the STDP discharge path is activated by the axon STDP pulse.

Figure 5:
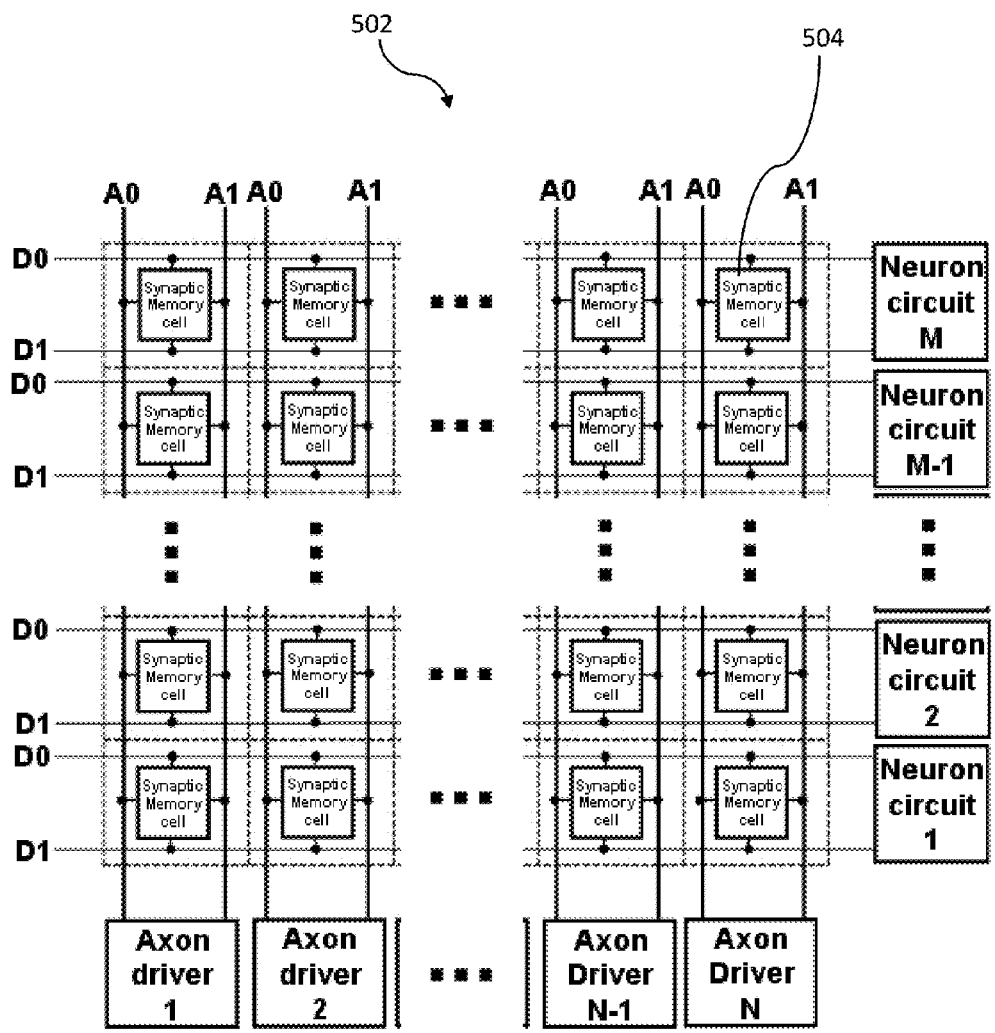
FIG. 5 shows an example neuromorphic memory circuit contemplated by the present invention.
Figure 6:
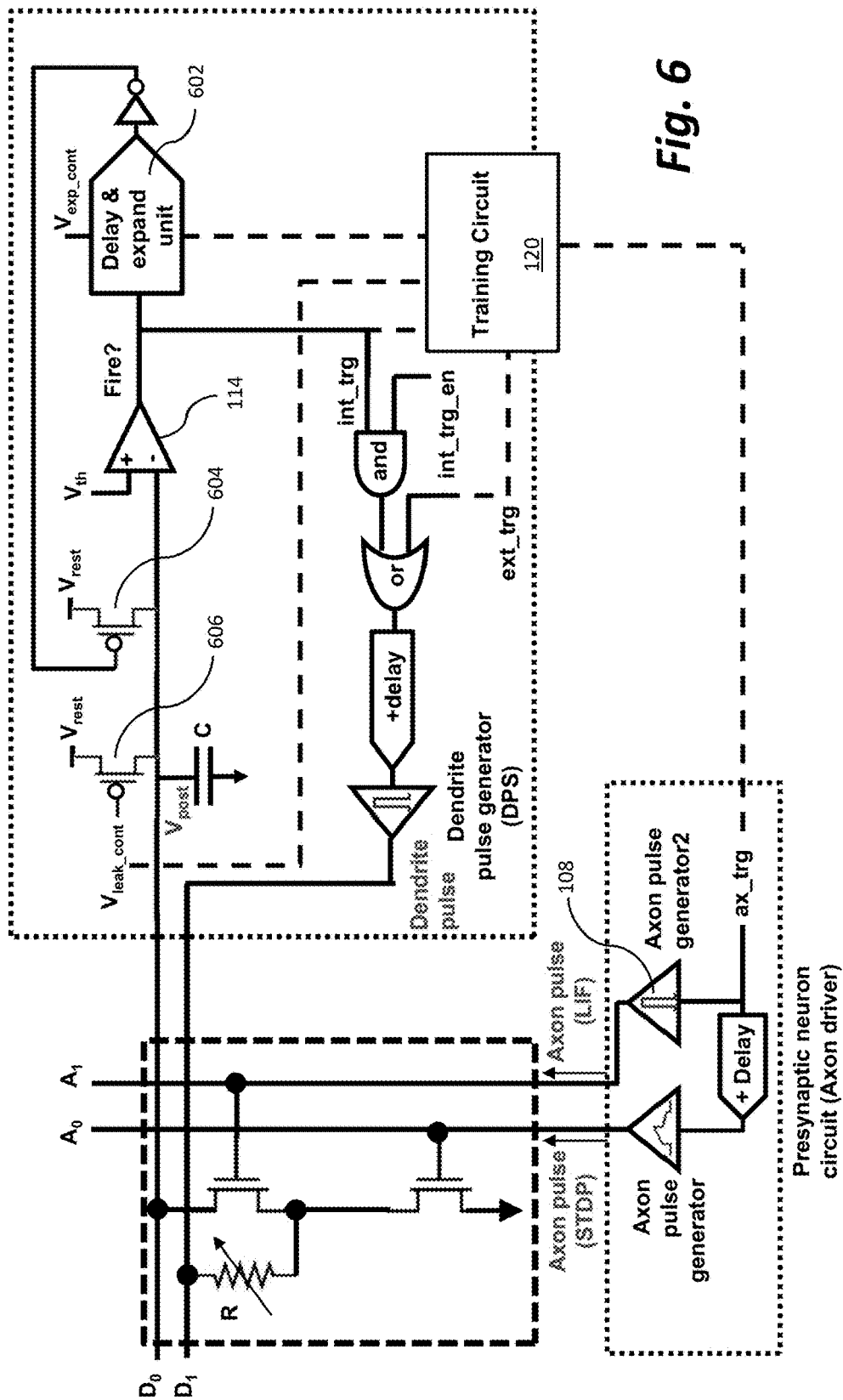
FIG. 6 shows an example neuromorphic memory circuit contemplated by the present invention.

FIGS. 5 and 6 show another example neuromorphic memory circuit contemplated by the present invention. The neuromorphic memory circuit a memory cell array 502. Each memory cell 504 in the memory cell array 502 includes a resistive memory element R programmable to a memory resistance.

A training circuit 120 is configured to measure the postsynaptic firing characteristic of each memory cell 504 in the memory cell array 502. Particularly, for each memory cell 504 in the memory cell array 502, the training circuit 120 triggers the memory cell's corresponding axon driver to fire at a selected frequency. All the other axon drivers should not fire. The training circuit 120 then measures the firing rate from the memory cell's corresponding neuron circuit. These steps are repeated for various frequencies and for all memory cells 504 in the memory cell array 502.

A postsynaptic capacitor C is coupled to a row of memory cells in the memory cell array 502. As discussed above, the postsynaptic capacitor C accumulates a LIF charge over time at a charge rate and includes a capacitor voltage $V_{post}$ proportional to the LIF charge. A leakage current $I_{leak}$ flows through a leak transistor 606 coupled to the postsynaptic capacitor C. The leak transistor 606 is configured to control the charge rate (i.e., leakage current $I_{leak}$) of the postsynaptic capacitor C. The training circuit 120 is configured to, for each memory cell in the memory cell array 502, adjust the leakage current $I_{leak}$ to the postsynaptic capacitor C by adjusting $V_{leak\_cont}$. As $V_{leak\_cont}$ is increased, the effective resistance of the leak transistor 606 is increased, thereby decreasing the leakage current $I_{leak}$. Conversely, as $V_{leak\_cont}$ is decreased, the effective resistance of the leak transistor 606 is decreased, thereby increasing the leakage current $I_{leak}$.

An axon LIF pulse generator 108 is coupled to a column of memory cells in the memory cell array 502. As discussed above, the axon LIF pulse generator 108 activates a LIF discharge path from the postsynaptic capacitor C through the resistive memory element R when the axon LIF pulse generator 108 generates axon LIF pulses.

A postsynaptic comparator 114 compares the capacitor voltage $V_{post}$ to a threshold voltage $V_{th}$ and generates a postsynaptic output pulse when the capacitor voltage $V_{post}$ passes the threshold voltage $V_{th}$. As discussed above, the postsynaptic output pulses include a postsynaptic firing characteristic dependent on a frequency of the axon LIF pulses.

A refractory circuit is coupled to the postsynaptic comparator 114. The refractory circuit is configured to prevent the postsynaptic comparator from generating additional postsynaptic output pulses until a refractory time passes since a preceding postsynaptic output pulse. In one embodiment, the refractory circuit is configured to prevent the capacitor voltage $V_{post}$ from passing the threshold voltage $V_{th}$ until the refractory time passes since the preceding output pulse. For example, $t_{refractory}$ is controlled by $V_{exp\_cont}$ issued from a training circuit 120 in this implementation. $V_{exp\_cont}$ controls a delay and expand unit 602, which turns on the strong PFET transistor 604 to restore $V_{post}$ to $V_{rest}$ for a period of time dependent on $V_{exp\_cont}$. In one embodiment, the delay and expand unit 602 includes a voltage controlled oscillator (VCO) responsive to $V_{exp\_cont}$. A counter coupled to the VCO is used to set the $t_{refractory}$ delay.

The training circuit 120 is configured to adjust the postsynaptic firing characteristic to match a target firing characteristic. As discussed above, the postsynaptic firing characteristic includes a postsynaptic firing rate that rises from a postsynaptic threshold frequency along a postsynaptic curve slope that asymptotically approaches a postsynaptic maximum frequency. Similarly, the target firing characteristic includes a target firing rate that rises from a target threshold frequency along a target curve slope that asymptotically approaches a target maximum frequency.

Figure 7:
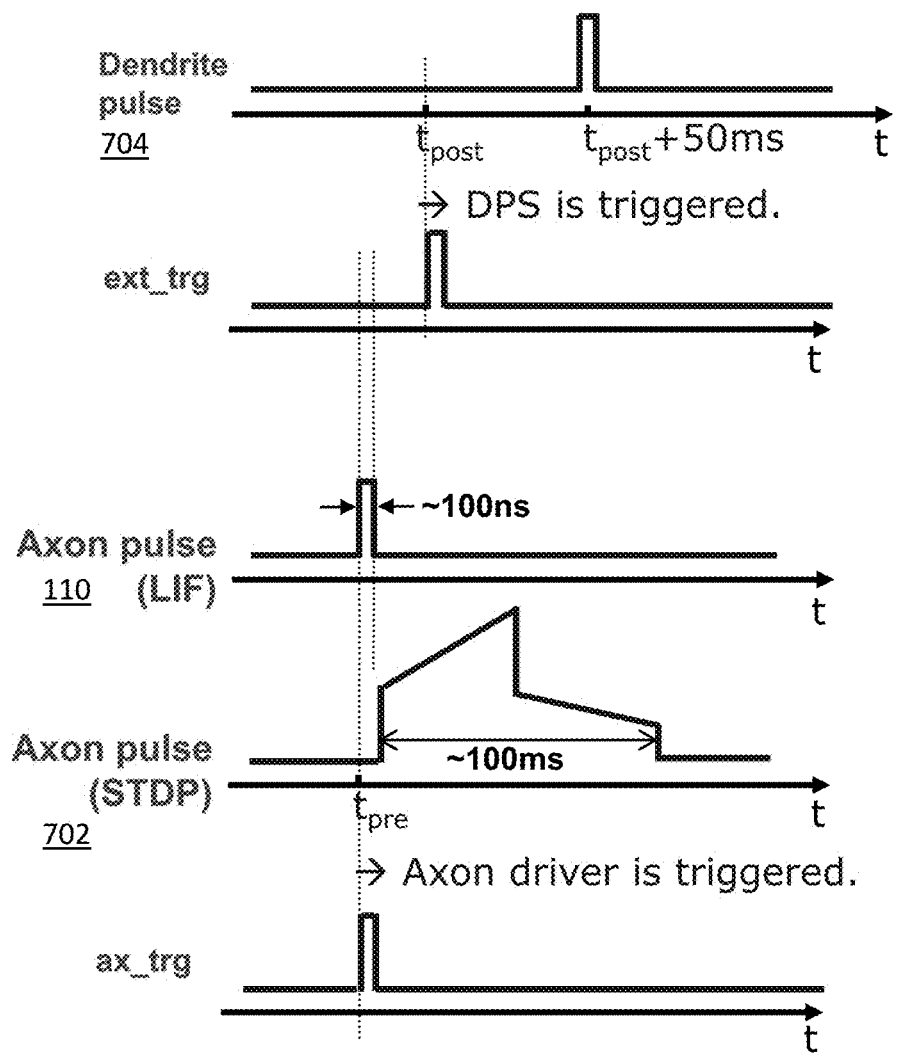
FIG. 7 shows an example timing diagram for adjusting the memory resistance of a resistive memory element during one mode of circuit operation contemplated by the present invention.

As discussed above, the training circuit 120 is configured to, for each memory cell in the memory cell array 502, adjust the memory resistance of the resistive memory element R such that the postsynaptic curve slope of the postsynaptic firing characteristic matches the target curve slope of the target firing characteristic. FIG. 7 shows an example timing diagram for adjusting the memory resistance of a resistive memory element during one mode of circuit operation.

In FIG. 7, an axon LIF pulse 110 and an axon STDP pulse 702 are triggered by an external ax_tg signal from the training circuit 120. Next, a dendrite STDP pulse 704 is triggered by an ext_trg signal from the training circuit 120. In one embodiment, a delay unit introduces a time delay (e.g., $t_{post}$+50 ms delay) between the ext_trg signal and the dendrite STDP pulse 704.

The axon STDP pulse 702 is longer than the axon LIF pulse 110. In a particular embodiment, the axon LIF pulse 110 is approximately 100 ns and the axon STDP pulse 702 is approximately 100 ms. It is noted that pulse timings shown in FIG. 7 are for illustration purposes only and may be adjusted without departing from the scope of the present invention.

As shown, the axon STDP pulse magnitude significantly decreases approximately half way through the pulse. Thus, if $\Delta t (t_{post}-t_{pre})>0$, the dendrite STDP pulse 704 is transmitted during the lower magnitude portion of the axon STDP pulse 702 and the phase change material is programmed toward the lower-resistance, set state. If $\Delta t (t_{post}-t_{pre})<0$, the dendrite STDP pulse 704 is transmitted during the higher magnitude portion of the axon STDP pulse 702 and the phase change material is programmed toward the higher-resistance, reset state. In this manner, the memory element simulates synapses that are strengthened if the firing of their presynaptic neuron precede the firing of the postsynaptic neuron, and weakened if the firing of their presynaptic neuron follow the firing of the postsynaptic neuron.

With the time delay ($t_{post}$+delay), the training circuit 120 can increase the memory cell's resistance by triggering the dendrite pulse generator 122 before triggering the axon STDP pulse generator 124. To decrease the memory cell's resistance, the training circuit 120 triggers the dendrite pulse generator 122 after triggering the axon STDP pulse generator 124.

As discussed above, the training circuit 120 is configured to, for each memory cell in the memory cell array 502, adjust the charge rate of the postsynaptic capacitor by adjusting $V_{leak\_cont}$ (see FIG. 6) such that the postsynaptic threshold frequency of the postsynaptic firing characteristic matches the target threshold frequency of the target firing characteristic.

Figure 8:
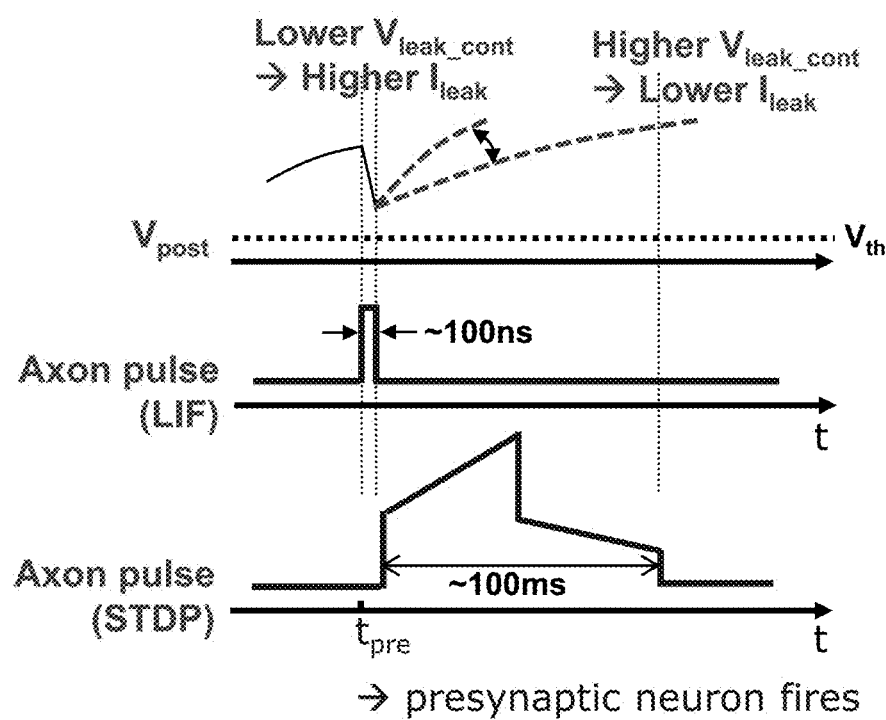
FIG. 8 shows an example timing diagram for adjusting the charge rate of the postsynaptic capacitor contemplated by the present invention.

FIG. 8 shows an example timing diagram for adjusting the charge rate of the postsynaptic capacitor C. As shown, the effective resistance of the leak transistor 606 is increased as $V_{leak\_cont}$ is increased. Conversely, the effective resistance of the leak transistor 606 is decreased as $V_{leak\_cont}$ is decreased.

Figure 9:
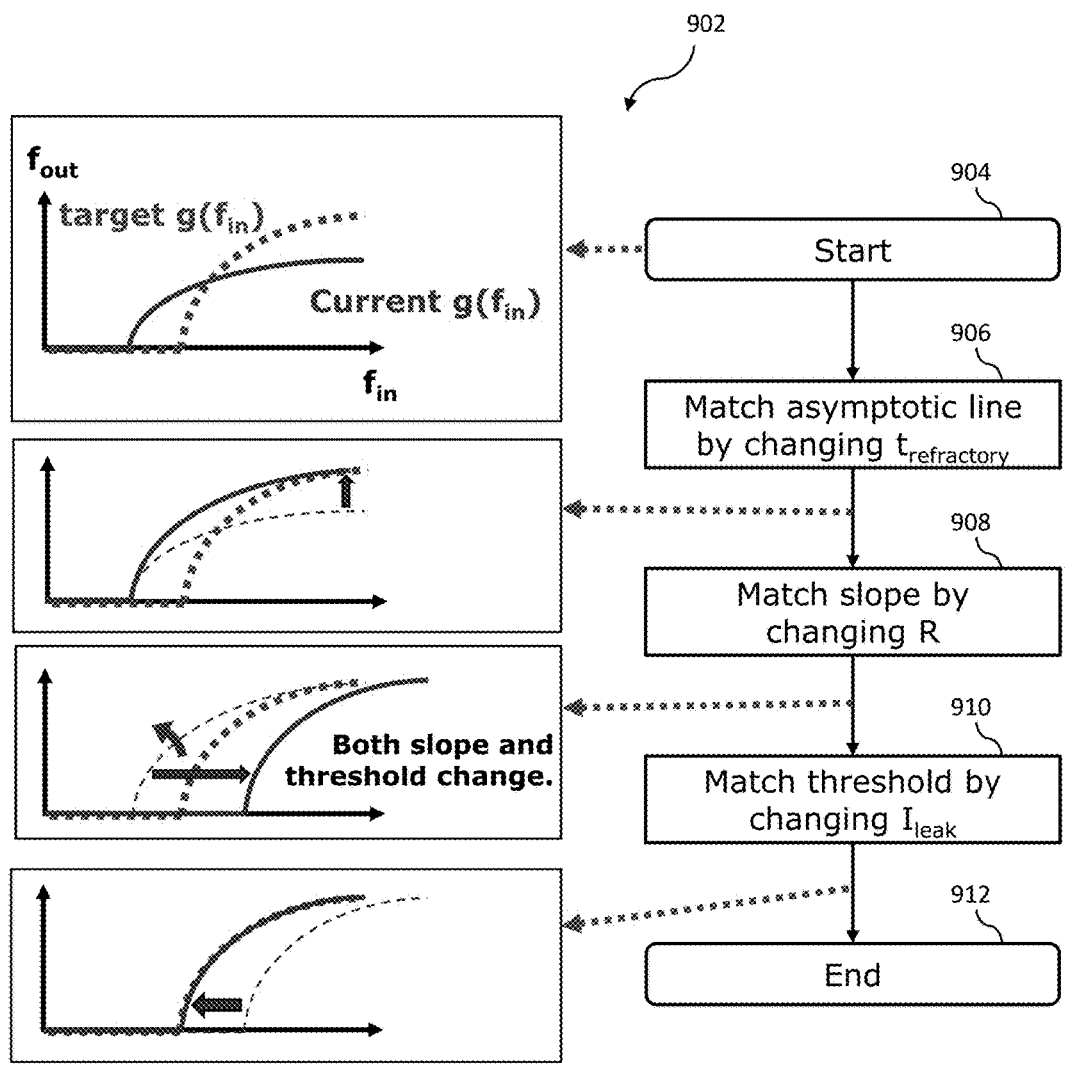
FIG. 9 shows an example procedure for matching the postsynaptic firing characteristic to a target firing characteristic contemplated by the present invention.

FIG. 9 shows an example procedure 902 for matching the postsynaptic firing characteristic to a target firing characteristic. At the start 904 of the procedure, the postsynaptic firing characteristic (referred to in the figure as current $g(f_{in})$) does not match the target firing characteristic (referred to in the figure as target $g(f_{in})$).

At step 906, the training circuit matches the asymptotic line of the postsynaptic firing characteristic to that of the target firing characteristic by changing $t_{refractory}$. As discussed above, $t_{refractory}$ may be controlled by $V_{exp\_cont}$ issued from the training circuit 120. $V_{exp\_cont}$ controls a delay and expand unit 608, which turns on the strong PFET transistor 604 to restore $V_{post}$ to $V_{rest}$ for a period of time $t_{refractory}$ dependent on $V_{exp\_cont}$.

Next, at step 908, the training circuit matches the slope of the postsynaptic firing characteristic to that of the target firing characteristic by changing the memory cell resistance. As discussed above, a phase change resistive memory element is programmed to a desired memory resistance by generating a dendrite pulse while the STDP discharge path is activated by an axon STDP pulse.

Next, at step 910, the training circuit matches the threshold frequency of the postsynaptic firing characteristic to that of the target firing characteristic by changing the leakage current $I_{leak}$ to the postsynaptic capacitor C. As discussed above, the training circuit 120 is configured to, for each memory cell in the memory cell array 502, adjust the leakage current $I_{leak}$ to the postsynaptic capacitor C by adjusting $V_{leak\_cont}$. As $V_{leak\_cont}$ is increased, the effective resistance of the leak transistor 606 is increased, thereby decreasing the leakage current $I_{leak}$. Conversely, as $V_{leak\_cont}$ is decreased, the effective resistance of the leak transistor 606 is decreased, thereby increasing the leakage current $I_{leak}$. At the end 912 of the procedure 902, the postsynaptic firing characteristic matches the target firing characteristic, within an acceptable margin of error.

Figure 10:
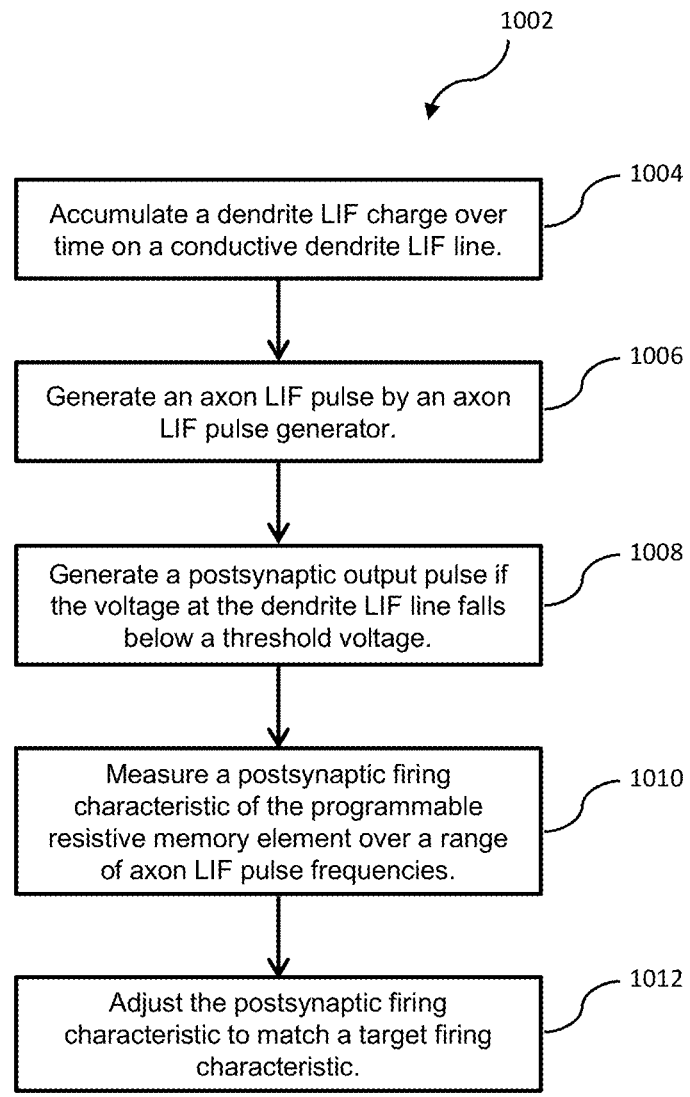
FIG. 10 shows an example method for operating a neuromorphic memory circuit, as contemplated by one embodiment of the present invention.

FIG. 10 shows an example method 1002 for operating a neuromorphic memory circuit contemplated by the present invention. The method 1002 includes accumulating operation 1004. During this operation, a LIF charge is accumulated over time on a conductive dendrite LIF line. In one embodiment, the LIF charge is accumulated by a postsynaptic capacitor connected to the conductive dendrite LIF line. Thus, the conductive dendrite LIF line includes a LIF voltage proportional to the LIF charge. After accumulating operation 1004, operation flow passes to generating operation 1006.

At generating operation 1006, axon LIF pulses are generated by an axon LIF pulse generator. The axon LIF pulses activate a LIF discharge path from the conductive dendrite LIF line through a programmable resistive memory element. As discussed above, this causes the LIF voltage to drop during the axon LIF pulse as the postsynaptic capacitor discharges through the programmable resistive memory element. After generating operation 1006, operation flow passes to generating operation 1008.

At generating operation 1008, postsynaptic output pulses are generated in response to the LIF voltage passing a threshold voltage. In one embodiment, a comparator coupled to the dendrite LIF line is used to check if the LIF voltage falls below the threshold voltage. After generating operation 1008, operation flow passes to measuring operation 1010.

At measuring operation 1010, the postsynaptic firing characteristic of the programmable resistive memory element in a memory array is measured over a range of axon LIF pulse frequencies. As discussed above, the postsynaptic firing characteristic includes a postsynaptic firing rate that rises from a postsynaptic threshold frequency along a postsynaptic curve slope that asymptotically approaches a postsynaptic maximum frequency.

In one embodiment, a training circuit is configured to measure the postsynaptic firing characteristic of each memory cell in the memory cell array. Particularly, for each memory cell in the memory cell array, the training circuit triggers the memory cell's corresponding axon driver to fire at a selected frequency. All the other axon drivers do not fire. The training circuit then measures the firing rate from the memory cell's corresponding neuron circuit. These steps are repeated for various frequencies.

Next, at adjusting operation 1012, the postsynaptic firing characteristic is adjusted to match a target firing characteristic. The target firing characteristic includes a target firing rate that rises from a target threshold frequency along a target curve slope that asymptotically approaches a target maximum frequency. Adjusting the postsynaptic firing characteristic may include adjusting the refractory time such that the postsynaptic maximum frequency of the postsynaptic firing characteristic matches the target maximum frequency of the target firing characteristic, adjusting a memory resistance of the programmable resistive memory element such that the postsynaptic curve slope of the postsynaptic firing characteristic matches the target curve slope of the target firing characteristic, and adjusting the charge rate of the postsynaptic capacitor such that the postsynaptic threshold frequency of the postsynaptic firing characteristic matches the target threshold frequency of the target firing characteristic.

As discussed above, adjusting the memory resistance of the programmable resistive memory element may include generating dendrite pulses on a conductive dendrite STDP line in response to the postsynaptic output pulses. After this operation, an axon STDP pulse is generated that activates a STDP discharge path from the dendrite STDP line through the programmable resistive memory element. The programmable resistive memory element is programmed to the memory resistance by generating the dendrite pulses while the STDP discharge path is activated by the axon STDP pulse.

Figure 11:
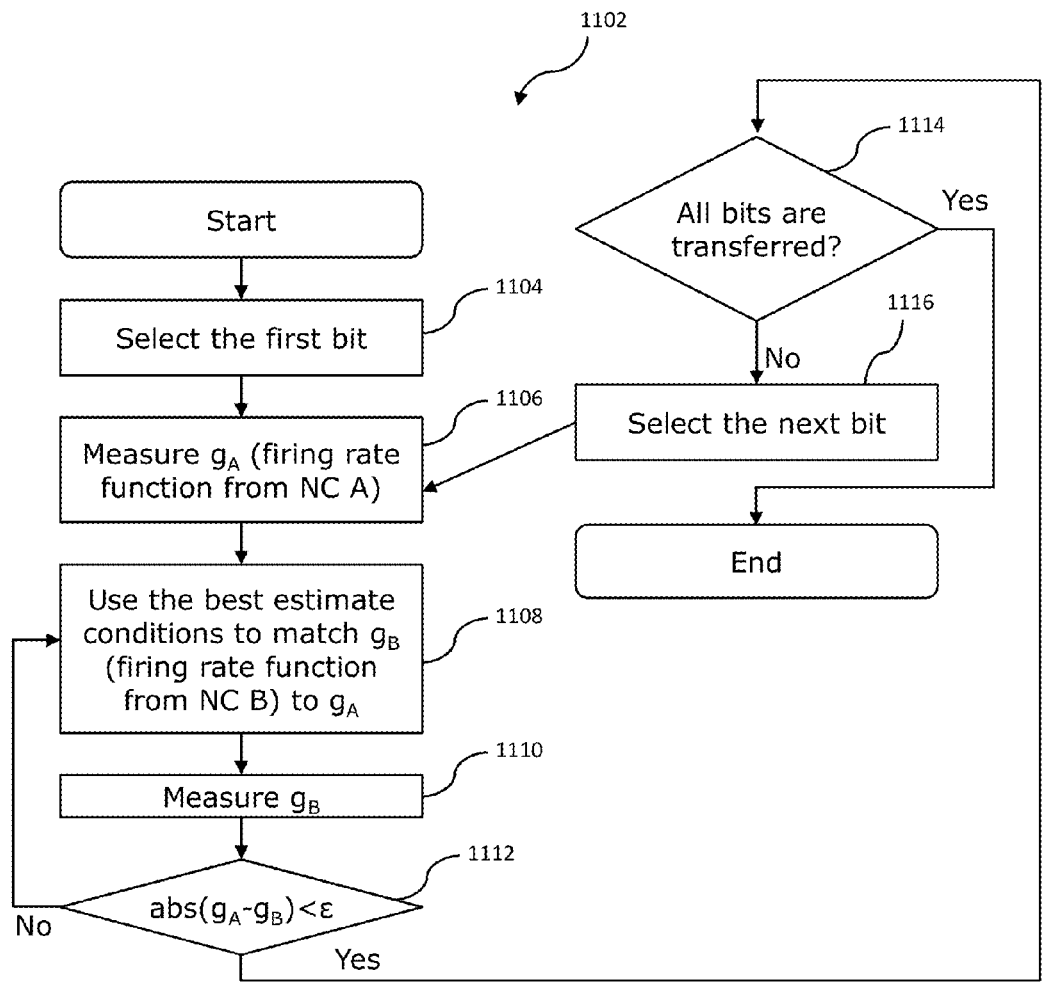
FIG. 11 an example method for training a neuromorphic core in accordance with the present invention.

FIG. 11 shows an example method 1102 for training a neuromorphic core (NC) in accordance with the present invention. The method starts are selecting operation 1104. During this operation, a first memory bit from neuromorphic core A is selected. As discussed above, the memory bit is selected by triggering the memory bit's corresponding axon driver and corresponding neuron circuit.

Next, at measuring operation 1106, the target firing characteristic of the selected memory bit (also referred to as the firing rate function) is measured over a range of axon LIF pulse frequencies by the training circuit. As discussed above, the target firing characteristic includes a target firing rate that rises from a target threshold frequency along a target curve slope that asymptotically approaches a target maximum frequency.

Next, at matching operation 1108, a postsynaptic firing characteristic of a corresponding memory bit from neuromorphic core B is matched to the target firing characteristic of the selected memory bit from neuromorphic core A. As discussed above, the matching operation 1108 is performed by adjusting the refractory time, memory resistance and/or charge rate associated with the corresponding memory bit from neuromorphic core B.

Next, at measuring operation 1110, the postsynaptic firing characteristic of the corresponding memory bit is measured over a range of axon LIF pulse frequencies. If, at determining operation 1112, the difference between the target firing characteristic and the postsynaptic firing characteristic is not within an acceptable margin of error, operations 1108 through 1112 are repeated. Otherwise, control passes to determining operation 1114.

Determining operation 1114 checks if all bits in the memory core have been trained. If not, selecting operation 1116 selects the next memory bit from neuromorphic core A and operations 1106 through 1114 are repeated. If determining operation 1114 confirms that all bits in the memory core have been trained, the procedure ends.

Accordingly, embodiments of the present invention can be used to duplicate a functionally identical neuromorphic core by transferring firing characteristics from one neuromorphic core to another. Using key parameters identified herein, the firing characteristics of a first neuromorphic core can be measured. The firing characteristics can then be transferred to other neuromorphic core using the procedures detailed herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present invention may be embodied as a system, method or computer program product. Accordingly, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:
1. A neuromorphic memory circuit comprising:
   a memory cell including a resistive memory element programmable to a memory resistance;
   a postsynaptic capacitor to build up a leaky integrate and fire (LIF) charge at a charge rate over time, the post- synaptic capacitor including a capacitor voltage proportional to the LIF charge;

an axon LIF pulse generator to activate a LIF discharge path from the postsynaptic capacitor through the resistive memory element when the axon LIF pulse generator generates axon LIF pulses;

a postsynaptic comparator to compare the capacitor voltage to a threshold voltage and generate postsynaptic output pulses when the capacitor voltage passes the threshold voltage, the postsynaptic output pulses including a postsynaptic firing characteristic dependent on a frequency of the axon LIF pulses;

a refractory circuit coupled to the postsynaptic comparator, the refractory circuit is configured to prevent the postsynaptic comparator from generating additional postsynaptic output pulses until a refractory time passes since a preceding postsynaptic output pulse; and a training circuit configured to adjust the postsynaptic firing characteristic to match a target firing characteristic, the postsynaptic firing characteristic includes a postsynaptic firing rate that rises from a postsynaptic threshold frequency along a postsynaptic curve slope that asymptotically approaches a postsynaptic maximum frequency, the target firing characteristic includes a target firing rate that rises from a target threshold frequency along a target curve slope that asymptotically approaches a target maximum frequency.

2. The neuromorphic memory circuit of claim 1, wherein the training circuit is configured to:

adjust the refractory time of the refractory circuit such that the postsynaptic maximum frequency of the postsynaptic firing characteristic matches the target maximum frequency of the target firing characteristic;

adjust the memory resistance of the resistive memory element such that the postsynaptic curve slope of the postsynaptic firing characteristic matches the target curve slope of the target firing characteristic; and adjust the charge rate of the postsynaptic capacitor such that the postsynaptic threshold frequency of the postsynaptic firing characteristic matches the target threshold frequency of the target firing characteristic.

3. The neuromorphic memory circuit of claim 1, further comprising a leak transistor coupled to the postsynaptic capacitor, the leak transistor configured to control the charge rate of the postsynaptic capacitor.

4. The neuromorphic memory circuit of claim 1, further comprising:

a dendrite pulse generator coupled to the resistive memory element, the dendrite pulse generator configured to generate dendrite pulses in response to the postsynaptic output pulses;

an axon spike timing dependent plasticity (STDP) pulse generator to generate an axon STDP pulse, the axon STDP pulse activates an STDP discharge path from the dendrite pulse generator through the resistive memory element when the axon STDP pulse generator generates the axon STDP pulse, the resistive memory element is programmed to the memory resistance by generating the dendrite pulses while the STDP discharge path is activated by the axon STDP pulse.

5. The neuromorphic memory circuit of claim 1, wherein the resistive memory element includes a phase change material.

6. The neuromorphic memory circuit of claim 5, wherein the phase change material has an electrical resistance and is programmable to a set state having a set electrical resistance and reset state having a reset electrical resistance at least a factor of 10 greater than the set electrical resistance, the phase change material includes an initial state having an initial electrical resistance between the set electrical resistance and the reset electrical resistance, the initial state is at a lower potential energy than the set state and the reset state such that the electrical resistance of the phase change material programmed to the set state or the reset state drifts toward the initial electrical resistance over time.

7. The neuromorphic memory circuit of claim 6, wherein the phase change material includes $Ge_xSb_yTe_z$, where a Ge atomic concentration x is within a range from 30% to 70%, a Sb atomic concentration y is within a range from 10% to 30%, and a Te atomic concentration z is within a range from 20% to 50%.

8. A neuromorphic memory circuit comprising:

a memory cell array, each memory cell in the memory cell array including a resistive memory element programmable to a memory resistance;

a postsynaptic capacitor coupled to a row of memory cells in the memory cell array, the postsynaptic capacitor to build up a leaky integrate and fire (LIF) charge at a charge rate over time, the postsynaptic capacitor including a capacitor voltage proportional to the LIF charge;

an axon LIF pulse generator coupled to a column of memory cells in the memory cell array, the axon LIF pulse generator to activate a LIF discharge path from the postsynaptic capacitor through the resistive memory element when the axon LIF pulse generator generates axon LIF pulses;

a postsynaptic comparator to compare the capacitor voltage to a threshold voltage and generate postsynaptic output pulses when the capacitor voltage passes the threshold voltage, the postsynaptic output pulses including a postsynaptic firing characteristic dependent on a frequency of the axon LIF pulses;

a refractory circuit coupled to the postsynaptic comparator, the refractory circuit is configured to prevent the postsynaptic comparator from generating additional postsynaptic output pulses until a refractory time passes since a preceding postsynaptic output pulse; and a training circuit configured to adjust the postsynaptic firing characteristic to match a target firing characteristic, the postsynaptic firing characteristic includes a postsynaptic firing rate that rises from a postsynaptic threshold frequency along a postsynaptic curve slope that asymptotically approaches a postsynaptic maximum frequency, the target firing characteristic includes a target firing rate that rises from a target threshold frequency along a target curve slope that asymptotically approaches a target maximum frequency.

9. The neuromorphic memory circuit of claim 8, wherein the training circuit is configured to, for each memory cell in the memory cell array:

adjust the refractory time of the refractory circuit such that the postsynaptic maximum frequency of the postsynaptic firing characteristic matches the target maximum frequency of the target firing characteristic;

adjust the memory resistance of the resistive memory element such that the postsynaptic curve slope of the postsynaptic firing characteristic matches the target curve slope of the target firing characteristic; and adjust the charge rate of the postsynaptic capacitor such that the postsynaptic threshold frequency of the postsynaptic firing characteristic matches the target threshold frequency of the target firing characteristic.

10. The neuromorphic memory circuit of claim 8, further comprising a leak transistor coupled to the postsynaptic capacitor, the leak transistor configured to control the charge rate of the postsynaptic capacitor.

11. The neuromorphic memory circuit of claim 8, further comprising:
a dendrite pulse generator coupled to the row of resistive memory elements in the memory cell array, the dendrite pulse generator configured to generate dendrite pulses in response to the postsynaptic output pulses;
an axon spike timing dependent plasticity (STDP) pulse generator coupled to the column of resistive memory elements in the memory cell array, the axon STDP pulse generator to generate an axon STDP pulse, the axon STDP pulse activates an STDP discharge path from the dendrite pulse generator through the resistive memory element when the axon STDP pulse generator generates the axon STDP pulse, the resistive memory element is programmed to the memory resistance by generating the dendrite pulses while the STDP discharge path is activated by the axon STDP pulse.

12. The neuromorphic memory circuit of claim 8, wherein each memory cell in the memory cell array includes a phase change material.

13. The neuromorphic memory circuit of claim 12, wherein the phase change material has an electrical resistance and is programmable to a set state having a set electrical resistance and reset state having a reset electrical resistance at least a factor of 10 greater than the set electrical resistance, the phase change material includes an initial state having an initial electrical resistance between the set electrical resistance and the reset electrical resistance, the initial state is at a lower potential energy than the set state and the reset state such that the electrical resistance of the phase change material programmed to the set state or the reset state drifts toward the initial electrical resistance over time.

14. The neuromorphic memory circuit of claim 13, wherein the phase change material includes $Ge_xSb_yTe_z$, where a Ge atomic concentration x is within a range from 30% to 70%, a Sb atomic concentration y is within a range from 10% to 30%, and a Te atomic concentration z is within a range from 20% to 50%.

15. The neuromorphic memory circuit of claim 8, wherein the refractory circuit is configured to prevent the capacitor voltage from passing the threshold voltage until the refractory time passes since the preceding postsynaptic output pulse.

16. A method for operating a neuromorphic memory circuit, the method comprising:
accumulating a dendrite leaky integrate and fire (LIF) charge over time on a conductive dendrite LIF line, the conductive dendrite LIF line including a LIF voltage proportional to the LIF charge;
generating axon LIF pulses, the axon LIF pulses activating a LIF discharge path from the conductive dendrite LIF line through a programmable resistive memory element;
generating postsynaptic output pulses in response to the LIF voltage passing a threshold voltage;
measuring a postsynaptic firing characteristic of the programmable resistive memory element over a range of axon LIF pulse frequencies, the postsynaptic firing characteristic includes a postsynaptic firing rate that rises from a postsynaptic threshold frequency along a postsynaptic curve slope that asymptotically approaches a postsynaptic maximum frequency;
adjusting the postsynaptic firing characteristic to match a target firing characteristic, the target firing characteristic includes a target firing rate that rises from a target threshold frequency along a target curve slope that asymptotically approaches a target maximum frequency.

17. The method of claim 16, further comprising preventing the LIF voltage from passing the threshold voltage until a refractory time passes since a preceding output pulse.

18. The method of claim 17, wherein adjusting the postsynaptic firing characteristic includes:
adjusting the refractory time such that the postsynaptic maximum frequency of the postsynaptic firing characteristic matches the target maximum frequency of the target firing characteristic;
adjusting a memory resistance of the programmable resistive memory element such that the postsynaptic curve slope of the postsynaptic firing characteristic matches the target curve slope of the target firing characteristic; and
adjusting the charge rate of the postsynaptic capacitor such that the postsynaptic threshold frequency of the postsynaptic firing characteristic matches the target threshold frequency of the target firing characteristic.

19. The method of claim 18, further comprising:
generating dendrite pulses on a conductive dendrite spike timing dependent plasticity (STDP) line in response to the postsynaptic output pulses; and
generating an axon STDP pulse, the axon STDP pulse activates an STDP discharge path from the dendrite STDP line through the programmable resistive memory element, the programmable resistive memory element is programmed to the memory resistance by generating the dendrite pulses while the STDP discharge path is activated by the axon STDP pulse.

20. The method of claim 16, wherein generating the postsynaptic output pulses includes comparing the LIF voltage to the threshold voltage.

* * * * *